US005324886A

United States Patent [19]

Nakatake et al.

[11] Patent Number: 5,324,886

[45] Date of Patent: Jun. 28, 1994

[54] INSULATING-LIQUID IMMERSED ELECTRICAL MACHINE

[75] Inventors: Ryoji Nakatake, Hitachiota; Yoshito Uwano, Hitachi; Takeshi Sakamoto, Ibaraki, all of Japan

[73] Assignee: Hitachi, Ltd., Tokyo, Japan

[21] Appl. No.: 825,831

[22] Filed: Jan. 28, 1992

Related U.S. Application Data

[63] Continuation of Ser. No. 550,580, Jul. 10, 1990.

[30] Foreign Application Priority Data

Jul. 10, 1989 [JP] Japan .................................. 1-175481

[51] Int. Cl.[5] ........................ H02G 15/26; H05K 5/00; H01F 27/10; H01F 27/02

[52] U.S. Cl. ................................. 174/12 R; 174/15.1; 174/17 LF; 336/58; 336/94; 361/699

[58] Field of Search ................. 174/11 R, 12 R, 14 R, 174/15.1, 17 R, 17 LF; 336/55, 58, 94; 361/37, 38, 379, 385

[56] References Cited

FOREIGN PATENT DOCUMENTS

| | | | |
|---|---|---|---|
| 529317 | 8/1956 | Canada | 174/12 R |
| 989947 | 5/1976 | Canada | 174/12 R |
| 0101154 | 2/1984 | European Pat. Off. . | |
| 758256 | 10/1933 | France | 174/12 R |
| 2147437 | 3/1973 | France | 336/58 |
| 2385200 | 3/1978 | France . | |
| 52-43940 | 4/1977 | Japan | 336/58 |
| 57-7911 | 1/1982 | Japan . | |
| 58-66315 | 4/1983 | Japan | 336/58 |
| 61-128506 | 6/1986 | Japan . | |
| 63-12116 | 1/1988 | Japan | 336/58 |
| 436468 | 11/1967 | Switzerland . | |
| 2161989 | 1/1986 | United Kingdom | 336/58 |

*Primary Examiner*—Leo P. Picard
*Assistant Examiner*—Bot Ledinh
*Attorney, Agent, or Firm*—Antonelli, Terry, Stout & Kraus

[57] ABSTRACT

An insulting-liquid immersed electrical machine comprises an electrical machine, a hermetically sealed tank containing the electrical machine, and insulating liquid arranged between the electrical machine and the tank, wherein the tank includes a deformable member through which gas and liquid cannot pass and whose shape is variable so that a receiving volume capable of receiving the insulating liquid between the tank and the electrical machine is variable. The insulating liquid completely fills the receiving volume in the tank, and a pressurizing arrangement is provided for adjusting the shape of the deformable member so that the pressure of the insulating liquid in the tank is kept at a suitable degree for preventing the insulating liquid from vaporizing.

14 Claims, 5 Drawing Sheets

INSULATING-LIQUID IMMERSED ELECTRICAL MACHINE

This application is a continuation application of application Ser. No. 07/550,580, filed Jul. 10, 1990.

FIELD OF THE INVENTION

The present invention relates to an electrical machine which is immersed in non-flammable insulating liquid for cooling the electrical machine and for increasing insulating strength in the electrical machine.

BACKGROUND OF THE INVENTION

A prior art insulating-liquid immersed inductor comprises, as shown in Japanese Patent Unexamined Publication No. 63-241909, an inductor body including an iron core and a coil, and a hermetically sealed tank in which the inductor body is arranged, non-flammable insulating liquid fills a part of a space between the inductor body and the hermetically sealed tank to immerse the inductor body therein, and the other part of the space is filled by pressurized insulating gas. A part of the pressurized insulating gas is absorbed in the non-flammable insulating liquid so that the volume of the pressurized insulating gas decreases in the tank. In the prior art insulating-liquid immersed inductor, when the pressure in the hermetically sealed tank is decreased according to the decrease of temperature in the tank, the absorbed insulating gas returns to gas, so that the insulating liquid includes many bubbles therein. The bubbles of the insulating gas cause the insulating strength to decrease in the inductor, because the insulating strength of the insulating gas is lower than that of the insulating liquid between the coated wires of the inductor.

SUMMARY OF THE INVENTION

The object of the present invention is to provide an insulating-liquid immersed electrical machine in which the insulating liquid does not include or absorb gas and is prevented from vaporizing.

According to the present invention, an insulating-liquid immersed electrical machine comprises, an electrical machine, a hermetically sealed tank containing the electrical machine, and insulating liquid arranged between the electrical machine and the tank, wherein the tank includes deformable means through which gas and liquid cannot pass and whose shape is variable so that a receiving volume capable of receiving the insulating liquid between the tank and the electrical machine is variable, with the insulating liquid completely filling the receiving volume in the tank. A pressurizing means is also provided for adjusting the shape of the deformable means so that the pressure of the insulating liquid in the tank is maintained at a suitable degree for preventing the insulating liquid from vaporizing.

In the insulating-liquid immersed electrical machine according to the present invention, since the tank includes the deformable means and since the insulating liquid completely fills the receiving volume in the tank, the receiving volume does not include gas therein and the gas is not absorbed by the insulating liquid in the receiving volume. And since the tank includes the deformable means whose shape is variable so that the receiving volume is variable, the deformable means compensates a change of the receiving volume even when the shape of the tank and the volumes of the electrical machine and insulating liquid change according to a change in temperature. And further, since the insulating-liquid immersed electrical machine further comprises the pressurizing means for adjusting the shape of the deformable means, the insulating liquid does not vaporize even when the receiving volume is changed. Therefore, gas bubbles decreasing insulating strength in the electrical machine are not generated in the insulating liquid.

DETAILED DESCRIPTION OF PREFERRED EMBODIMENTS

Figure 1:
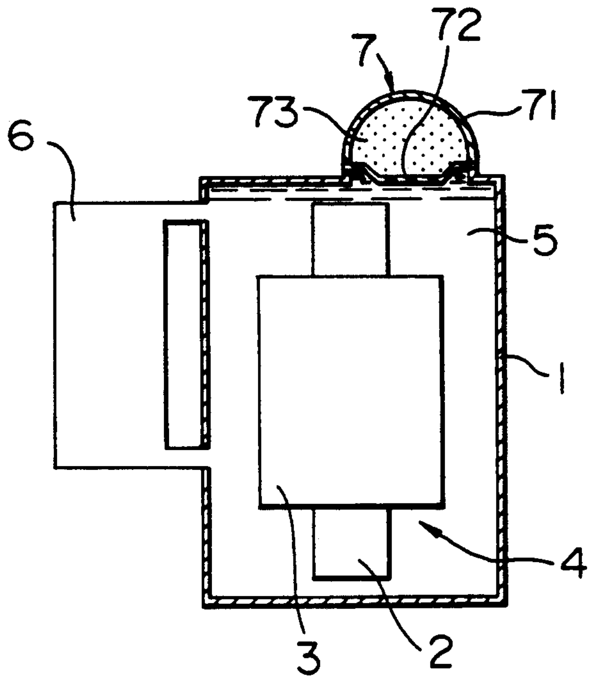
FIG. 1 is a partial cross-sectional view of an insulating-liquid immersed electrical machine according to the present invention.

As shown in FIG. 1, an insulating-liquid immersed electrical machine according to the present invention includes an inductor body 4 having an iron core 2 and a coil 3 accommodated in a hermetically sealed tank 1. Incombustible and insulating liquid 5 fills a volume between the tank 1 and the inductor body 4 to cool the inductor body 4 and to increase insulating strength in the inductor body 4. The non-flammable liquid 5 is, for example, perfluorocarbon liquid whose main component is $C_8F_{16}O$. The tank 1 contains a radiator 6 for cooling the incombustible liquid 5 heated by the operation of the inductor body 4. Tank volume adjusting means 7 is arranged at an upper portion of the tank 1 to adjust a volume capable of receiving the insulating liquid 5 for surrounding the inductor body 4 in the tank 1 and to pressurize the insulating liquid 5, for example, more than the atmospheric pressure. The tank volume adjusting means 7 has a hermetically sealed cover 71 fixed to the tank 1 and a flexible or deformable member or sheet 72, through which gas and liquid cannot pass, which defines a chamber together with the cover 71 and which defines the tank volume capable of receiving the insulating liquid 5 together with the tank 1. Since the deformable member 72 can deform, the volume capable of receiving the insulating liquid 5 in the tank 1 is changed. Pressurized gas 73 is inserted into the chamber defined by the sealed over 71 and deformable member 72 to press the deformable member 72 and to adjust the shape of the deformable member 72 so that the tank volume is adjusted according to the volume of the insulating liquid 5; and the insulating liquid 5 in the tank 1 is pressurized, for example, more than the atmospheric pressure (about 0.1 MPa) and less than 0.3 MPa. The pressurized gas 73 and the deformable member 72 constitute pressurizing means for pressurizing the liquid 5 in tank 1. The pressure of the gas 73 is a driving force agaisnt the member 72 and is determined to set the pressure of the insulating liquid 5 at a suitable degree for preventing the insulating liquid 5 from vaporizing even when the temperature of the insulating liquid 5 is increased by the heat of the inductor body 4 or by the air surrounding the tank 1. The gas 73 may be, for example, atmosphere or insulating gas or inert gas. Since the gas 73 and the insulating liquid 5 cannot pass through the deformable member 72 and since the insulating liquid 5 completely fills the tank volume capable of receiving the insulating liquid 5 in the tank 1, gas is not included or absorbed by the insulating liquid 5. Therefore, bubbles of the gas are not generated, even when the temperature of the insulating liquid 5 is increased and/or the pressure of the insulating liquid 5 in the tank is decreased.

Figure 2:
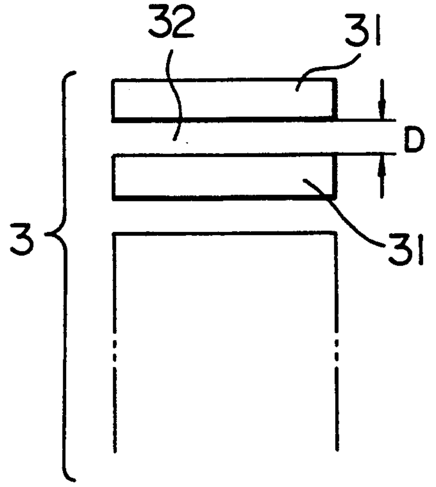
FIG. 2 is a schematic cross-sectional view showing a part of a coil used in the insulating-liquid immersed electrical machine according to the present invention.

In the structure of the coil 3 as shown in FIG. 2, a passage 32 for the insulating liquid 5 extends radially between coated wires 31 of the coil 3. A width of the insulating liquid passage 32 is indicated by D in FIG. 2.

Figure 3:
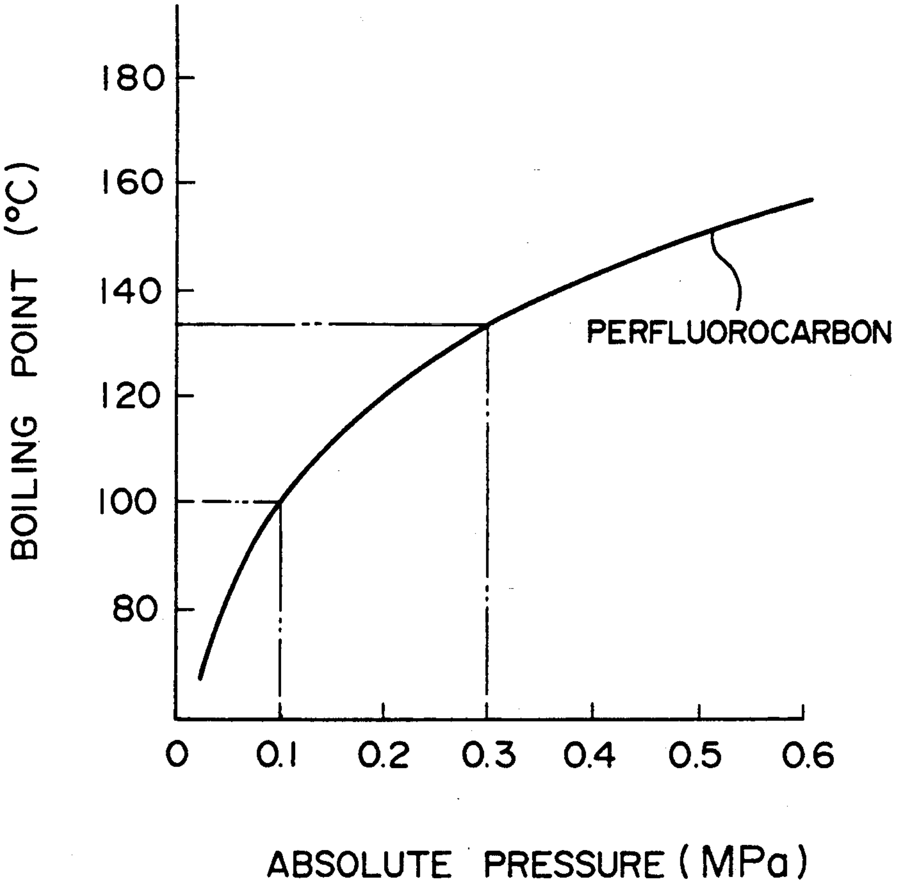
FIG. 3 is a graphical illustration of the boiling point characteristics relative to absolute pressure in perfluorocarbon liquid used in the insulating-liquid immersed electrical machine according to the present invention.

The insulating liquid 5 flows in the passage 32 to cool the inductor body 4; and the temperature of the insulating liquid 5 is increased by the heat generated by the operation of the inductor body 4. The heated insulating liquid 5 flows to the radiator 6 for cooling the insulating liquid 5 so that the temperature of the insulating liquid 5 surrounding the inductor body 4 is kept at a low degree. Therefore, the insulating liquid 5 can cool the inductor body 4 effectively and the insulating characteristic of the insulating liquid 5 is not decreased. Since the insulating liquid 5 is pressurized, for example, more than 0.1 MPa and less than 0.3 MPa through the deformable member 72 by the pressurized gas 73, the boiling point of the insulating liquid 5 is set at a high degree, as shown in FIG. 3. Therefore, bubbles of the vaporized insulating liquid are not generated, for example, in the insulating liquid passage 32 between the coated wires 31 of the coil 3, even when the inductor body 4 begins to operate or even when the electrical current flowing in the coated wires 31 increases rapidly; that is, even when the temperature of the insulating liquid 5 is increased rapidly. In this way, the insulating strength of the insulating liquid 5 is always kept at a high degree.

Further, though width D of a prior art insulating liquid passage is about 5 mm, the width D of the insulating liquid passage 32 according to the present invention may be small, for example, less than 2 mm. This is possible because the gas is not absorbed by the insulating liquid 5, the bubbles of the vaporized insulating liquid are not generated and the kinematic viscosity 0.8 cts of the perfluorocarbon liquid ($C_8F_{16}O$) is significantly smaller than the kinematic viscosity 7.5 cts of mineral oil. Therefore, the size of the inductor body 4 may be small.

If the pressure of the insulating liquid 5 and the pressure of the gas 73 is maintained between 0.1 MPa and 0.3 MPa, the tank 1 and the cover 71 do not require a special structure for resisting pressure.

Figure 4:
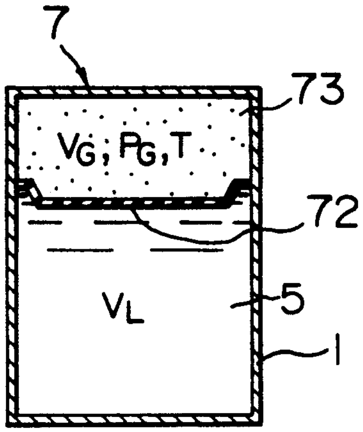
FIGS. 4 and 5 are partial cross-sectional views showing change in shape of deformable means of the insulating-liquid immersed electrical machine according to the present invention, which deformable means is deformed according to change in temperature.
Figure 5:
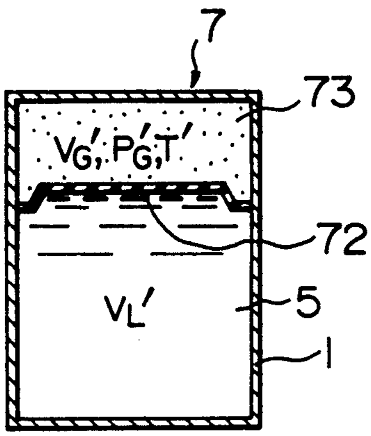

When the insulating liquid 5 is perfluorocarbon liquid, a suitable volume of the chamber defined by the deformable member 72 with the cover 71 is determined as follows. Please refer to FIGS. 4 and 5. On the basis of Boyle's and Charles' laws when surrounding temperature $\theta$ is -25° C., the volume of the insulating liquid 5 is $V_L$, the volume of the gas 73 is $V_G$, the pressure of the gas is $P_G$, and the temperature of the gas 73 is T, as shown in FIG. 4; and when surrounding temperature $\theta'$ is 80° C., the volume of the insulating liquid 5 is $V_l'$, the volume of the gas 73 is $V_G'$, the pressure of the gas is $P_G'$, and the temperature of the gas 73 is T', as shown in FIG. 5. Relationships between these are shown by the following formulas:

$$(P_G \cdot V_G)/T=(P_G' \cdot V_G')/T \quad (1)$$

$$V_G=X \cdot V_L \quad (2)$$

$$V_G'=X \cdot V_L - V_L \cdot \beta \cdot (\theta'-\theta) \quad (3)$$

where:

X = a rate of $V_G$ relative to $V_L$; and $\beta$ = an expansion coefficient of the insulating liquid When the formulas (2) and (3) are combined with the formula (1), the following relationships result:

$$(P_G \cdot X \cdot V_L)/T=P_G' \cdot V_L \cdot \{X-\beta \cdot (\theta'-\theta)\}/T \quad (4)$$

$$X/\{X-\beta \cdot (\theta'-\theta)\}=(P_G' \cdot T)/(P_G \cdot T) \quad (5)$$

According to the formula (5), when $P_G$ is 0.1 MPa, T is 253 (273−20)° k, $\theta$ is −20° C., $P_G'$ is 0.3 MPa, T' is 358(273+85)° k, $\theta'$ is 85° C. and $\beta$ is $15.4 \cdot 10^{-4}$ (1/° C.), $$X=0.3$$

Therefore, the suitable volume of the chamber 73 is thirty percent of the volume of the insulating liquid 5, when the surrounding temperature $\theta$ is −25° C.

In this embodiment, the reliability of the insulating strength is improved and the stable insulating characteristic is maintained. Further, the size of the coil may be small, the tank does not require special structure for resisting pressure, and a low-cost insulating-liquid immersed electrical machine can be provided.

Figure 6:
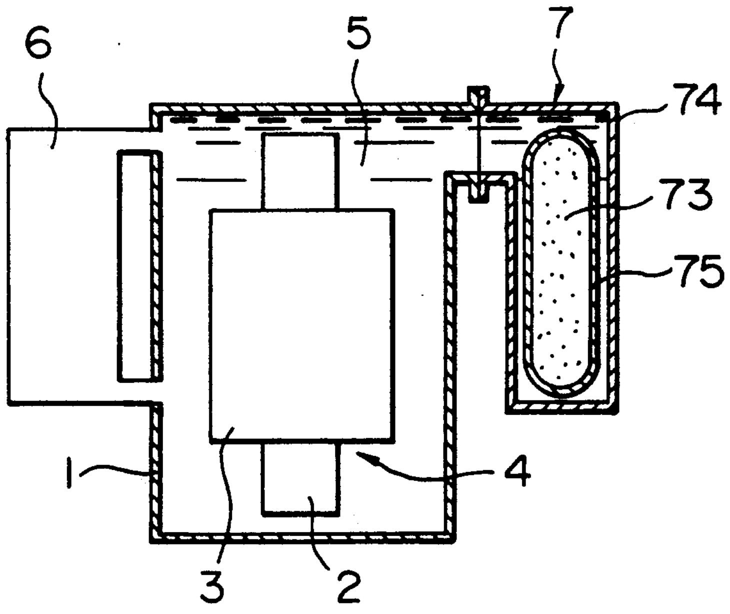
FIGS. 6 to 10 are partial cross-sectional views showing the other embodiments of the insulating-liquid immersed electrical machine according to the present invention.

As shown in FIG. 6, a tank volume adjusting means 7 includes a case 74 detachably mounted on the tank 1, with an interior thereof communicating with the interior of the tank 1, and with a balloon-shaped deformable member 75 having a variable volume. Pressurized gas 73 is inserted into the deformable member 75 to adjust the volume of the balloon-shaped deformable member 75 for pressurizing the insulating liquid 5 contained by the case 74. The gas 73 and the insulating liquid 5 cannot pass through the deformable member 75 and the insulating liquid 5 completely fills a volume capable of receiving the insulating liquid 5 in the tank 1 and the case 74. The case 74 may be arranged at an upper portion of the tank 1 or at a side portion thereof. In this construction, the insulating strength is improved and the size of the insulating-liquid immersed electrical machine may be small during transportation thereof because of the detachable structure of the tank volume adjusting means 7.

Figure 7:
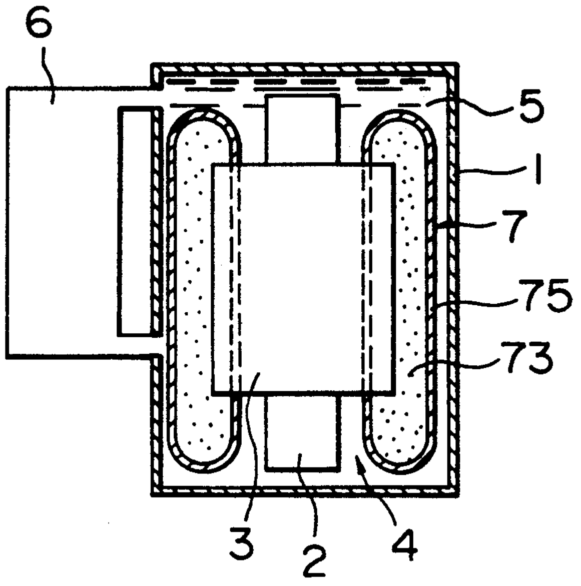

In the embodiment of FIG. 7, the tank volume adjusting means 7 includes a balloon-shaped deformable member 75 having an outer variable volume, with the pressurized gas 73 being inserted to adjust the volume of the balloon-shaped deformable member 75 for pressurizing the insulating liquid 5 contained in the tank 1 to a suitable degree. The gas 73 and the insulating liquid 5 cannot pass through the deformable member 75 and the insulating liquid 5 completely fills a volume capable of receiving the insulating-liquid 5 surrounding the inductor body 4 in the tank 1. In this construction, the insulating strength is improved, the volume of the insulating liquid 5 completely filling the volume capable of receiving the insulating liquid 5 surrounding the inductor body 4 in the tank 1 may be small, and the volume of the gas 73 also may be small because the required volume of the insulating liquid 5 is small. Therefore, the size of the insulating-liquid immersed electrical machine is small.

Figure 8:
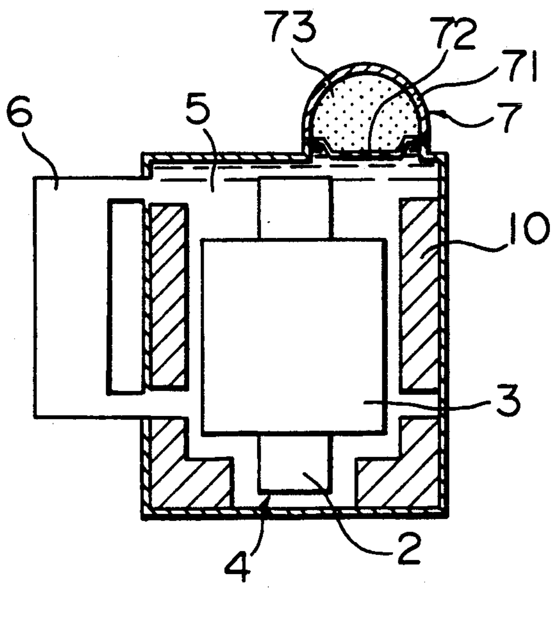

In the embodiment of FIG. 8, corresponding essentially to FIG. 1, solid insulating members 10 are arranged between the inductor body 4 and the tank 1. In this construction, the insulating strength is improved, the volume of the insulating liquid 5 completely filling the volume capable of receiving the insulating liquid 5 surrounding the inductor body 4 in the tank 1 may be small, and the volume of the gas 73 also may be small because the required volume of the insulating liquid 5 is small. Therefore, the size of the insulating-liquid immersed electrical machine is small.

Figure 9:
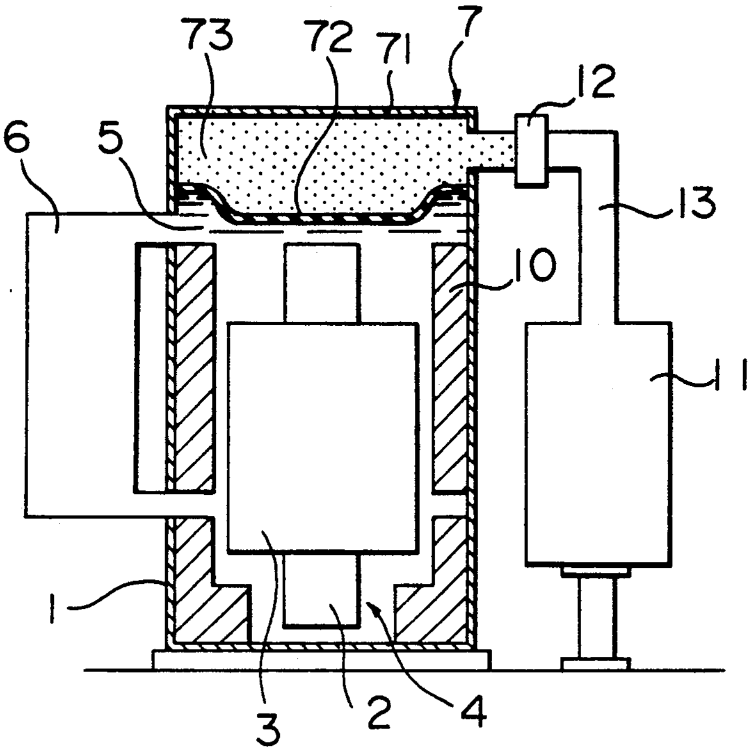

In the embodiment of FIG. 9, the inductor body 4 includes an iron core 2 and coil 3, with the hermetically sealed tank 1 containing the inductor body 4 and the radiator 6. Tank volume adjusting means 7 is arranged at an upper portion of the tank 1, with a tank volume adjusting means 7 including a deformable member 72 defining, with a cover 71, a chamber for accommodating the pressurized gas 73 and also defining the tank volume capable of receiving the insulating liquid 5 accommodated in the tank 1. The insulating liquid 5 completely fills the tank volume capable of receiving the insulating liquid 5 in the tank 1. The solid insulating members 10 are arranged between the inductor body 4 and the tank 1. A second tank 11 is connected to the chamber containing gas 73 through a conduit 13 and a pressure responsive discharge valve 12 which connects the chamber containing gas 73 to the second tank 11 only when the pressure in the chamber containing gas 73 increases more than a predetermined degree. The predetermined degree is set less than the resisting pressure strength of the tank 1 or the portion 71 thereof. Therefore, the pressure in the chamber containing gas 73 or in the tank 1 is prevented from increasing more than the predetermined degree or the resisting pressure strength of the tank 1, so that the tank 1 is prevented from being destroyed by the pressure more than the resisting pressure strength of the tank 1. And if the deformable member 72 is destroyed, the insulating liquid 5 flows into the second tank 11 so that the insulating liquid 5 does not flow to the outside. The pressure responsive discharge valve 12 has an electrical switch which cuts off the supply of electrical current to the inductor body 4 only when the pressure responsive discharge valve 12 connects the chamber containing gas 73 to the second tank 11.

Figure 10:
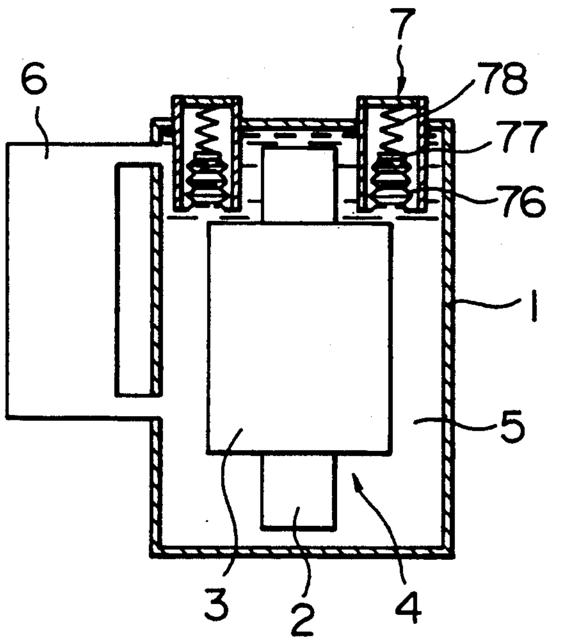

In the embodiment of FIG. 10, the inductor body 4 having the iron core 2 and the coil 3 is contained by the hermetically sealed tank 1. The non-flammable and insulating liquid 5 fills the tank volume between the tank 1 and the inductor body 4. The tank 1 contains the radiator 6 for cooling the non-flammable liquid 5. At least one tank volume adjusting means 7 is arranged at an upper portion of the tank 1 to adjust a volume capable of receiving the insulating liquid 5 for surrounding the inductor body 4 in the tank 5 and to pressurize the insulating liquid 5. The tank volume adjusting means 7 has a bellows 76 which is fixed to the tank 1, through which gas and liquid cannot pass and whose inside communicates with the inside of the tank 1 to define the tank volume capable of receiving the insulating liquid 5 together with the -tank 1. Since the bellows 76 can deform to change an interior volume, the volume capable of receiving the insulating-liquid 5 in the tank 1 is changed. A spring 78 arranged between the tank 1 and the bellows presses the bellows 76 through a piston plate 77 to adjust the shape of the bellows 76 so that the tank volume is adjusted according to the volume of the insulating liquid 5 and the insulating liquid 5 in the tank 1 is pressurized, for example, more than the atmospheric pressure (about 0.1 MPa) and less than 0.3 MPa. The pressing force of the spring 78 is determined to set the pressure of the insulating liquid 5 at a suitable degree for preventing the insulating liquid 5 from vaporizing even when the temperature of the insulating liquid 5 is increased by the heat of the inductor body 4 or by the air surrounding the tank 1. The insulating liquid 5 completely fills the tank volume capable of receiving the insulating liquid 5 in the tank 1. A required volume V for compensating a change in volume of the insulating liquid 5 is determined by the following formula:

$$V = \beta \cdot (\theta' - \theta) \cdot V_L$$
$$= 15.4 \cdot 10^{-4} \cdot 105 \cdot V_L = 0.16\ V_L$$

Therefore, an adjustable inside volume of the bellows 76 may be sixteen percent of the volume of the insulating liquid 5, so that the size of the insulating liquid immersed electrical machine may be small.

What is claimed is:

1. An insulating-liquid immersed electrical machine comprising a hermetically sealed tank, an insulating liquid of perfluorocarbon accommodated in said hermetically sealed tank to completely fill a receiving volume in the interior of said tank, and pressurizing means maintaining the insulating liquid at a pressure higher than atmospheric pressure which prevents the perfluorocarbon insulating liquid from vaporizing to keep a complete liquid condition of the perfluorocarbon insulating liquid in the tank even when the temperature of the liquid is increased by heat of the electrical machine, said pressurizing means including a flexible member facing said interior of said hermetically sealed tank filled by sad insulating-liquid and a driving force source applying a force to the flexible member so that the flexible member is deformed and keeps the insulating perfluorocarbon liquid at said pressure higher than atmospheric pressure for increasing a boiling point of the insulating liquid and preventing vaporization of the liquid.

2. An insulating-liquid immersed electrical machine according to claim 1, wherein the pressurizing means includes a spring means as the driving force source.

3. An insulating-liquid immersed electrical machine according to claim 1, wherein the flexible member is flexible sheet.

4. An insulating-liquid immersed electrical machine according to claim 1, wherein the flexible member is bellows.

5. An insulating-liquid immersed electrical machine according to claim 1, wherein the flexible member is a balloon-shaped member having pressurized gas therein as the driving force source.

6. An insulating-liquid immersed electrical machine according to claim 5, wherein the balloon-shaped member is accommodated in the tank.

7. An insulating-liquid immersed electrical machine according to claim 5, further comprising a case communicating with the tank, wherein the balloon-shaped member is accommodated in the case.

8. An insulating-liquid immersed electrical machine according to claim 1, wherein the insulating-liquid is non-flammable.

9. An insulating-liquid immersed electrical machine according to claim 1, further comprising a second tank and a pressure responsive discharge valve means for connecting the second tank to the first-mentioned tank only when a pressure in the first-mentioned tank is more than a predetermined pressure so as to decrease the pressure in the first-mentioned tank.

10. An insulating-liquid immersed electrical machine according to claim 1, wherein the pressuring means includes a pressurized gas at a pressure greater than atmospheric pressure acting against the flexible member as the driving force source.

11. An insulating-liquid immersed electrical machine according to claim 1, wherein the pressurizing means is arranged outside of the tank.

12. An insulating-liquid immersed electrical machine according to claim 1, wherein the insulating-liquid immersed electrical machine further comprises a heat radiator means on the tank.

13. An insulating-liquid immersed electrical machine comprising a hermetically sealed tank, an insulating liquid of perfluorocarbon accommodated in said hermetically sealed tank to completely fill a receiving volume in the interior of said tank, and pressurizing means maintaining the insulating liquid at a pressure higher than atmospheric pressure which prevent the perfluorocarbon insulating liquid from vaporizing to keep a complete liquid condition of the perfluorocarbon insulating liquid in the tank even when the temperature of the liquid is increased by heat of the electrical machine, said pressurizing means including a flexible member facing said interior of said hermetically sealed tank filled by said insulating-liquid and a driving force source applying a force to the flexible member so that the flexible member is deformed and keeps the insulating perfluorocarbon liquid at said pressure higher than atmospheric pressure for increasing a boiling point of the insulting liquid and preventing vaporization of the liquid, wherein a pressurizing pressure of said pressurizing means is between 0.1 MPa and 0.3 MPa.

14. An insulating-liquid immersed electrical machine comprising a hermetically sealed tank, an insulating liquid of perfluorocarbon accommodated in said hermetically sealed tank to completely fill a receiving volume in the interior of said tank, and pressurizing means maintaining the insulating liquid at a pressure higher than atmospheric pressure which prevent the perfluorocarbon insulating liquid from vaporizing to keep a complete liquid condition of the perfluorocarbon insulating liquid in the tank even when the temperature of the liquid is increased by heat of the electrical machine, said pressurizing means including a flexible member facing said interior of said hermetically sealed tank filled by said insulating-liquid and a driving force source applying a force to the flexible member so that the flexible member is deformed and keeps the insulating perfluorocarbon liquid at said pressure higher than atmospheric pressure for increasing a boiling point of the insulting liquid and preventing vaporization of the liquid, wherein the pressurizing means includes a pressurized gas at a pressure greater than atmospheric pressure acting against the flexible member s the driving force source, and wherein the machine further comprises a space receiving the pressurized gas, which space has a volume which is about thirty percent of a volume of the insulating liquid.

* * * * *